United States Patent [19]

Porter et al.

[11] Patent Number: 4,673,592
[45] Date of Patent: * Jun. 16, 1987

[54] METAL PLANARIZATION PROCESS

[75] Inventors: Vernon R. Porter, Plano; Samuel C. Baber, Richardson, both of Tex.

[73] Assignee: Texas Instruments Incorporated, Dallas, Tex.

[*] Notice: The portion of the term of this patent subsequent to May 15, 2001 has been disclaimed.

[21] Appl. No.: 384,353

[22] Filed: Jun. 2, 1982

[51] Int. Cl.$^4$ .......................................... H01L 21/268
[52] U.S. Cl. .............................. 427/53.1; 204/192.1; 156/644; 156/643; 427/88; 427/93
[58] Field of Search ................... 427/35, 53.1, 88, 93; 204/192 SP; 156/643, 644

[56] References Cited

U.S. PATENT DOCUMENTS

| 4,377,421 | 3/1983 | Wada | 427/53.1 |
| 4,388,517 | 6/1983 | Schulte | 219/121 LM |
| 4,448,636 | 5/1984 | Baber | 156/643 |
| 4,465,716 | 8/1984 | Baber et al. | 427/53.1 |

FOREIGN PATENT DOCUMENTS 2065369 6/1981 United Kingdom .

Primary Examiner—John D. Smith
Attorney, Agent, or Firm—Robert Groover, III; James T. Comfort; Melvin Sharp

[57] ABSTRACT

The present invention discloses a method for planarizing contact holes, vias, and other surface depressions, during the fabrication of an integrated circuit structure. Differential thermal conductivities are exploited to selectively remove a deposited film of metal from high-thermal-resistance areas, such as silicon dioxide or other insulators, and not from low-thermal-resistance areas, such as silicon or metal. By repetition of this step, very deep depressions, having a high aspect ratio, are reliably filled.

14 Claims, 4 Drawing Figures

METAL PLANARIZATION PROCESS

BACKGROUND OF THE INVENTION

The present invention relates to a method for planarizing depressed areas, such as contact holes, during the fabrication of an integrated circuit.

One difficulty in the fabrication of integrated circuit structures is the relatively large area which must be taken up by contact holes and vias. This is because, if the walls of a contact hole are too steep, step coverage problems may result when metal is deposited, so that a good electrical connection to the contact level does not result. Particularly if integrated circuits are to be formed using a large number of levels, such as double-metal circuits, a contact hole may have to be etched through a large thickness of material, and therefore may require a large width in the prior art.

A related difficulty is the vertical excursion which the topography of multi-level integrated circuits may create. That is, since the thickness variations of successive layers are cumulative, substantial thickness variation may result in the uppermost level, particularly in a structure which has more than two layers of conductors, such as a double-metal structure.

However, structures having more than two layers of conductors are highly desirable in large random logic integrated circuits, since they facilitate the circuit designer's task and reduce the average length of a connection.

Thus, it is an object of the present invention to provide a method for forming metal or silicide contacts to the bottom of a hole with very steep walls.

It is a further object of the present invention to provide a method for forming contacts to the bottom of a contact hole with vertical walls.

It is a further object of the present invention to provide a method for planarizing depressed areas in an integrated circuit structure by filling them with conductive material.

It is a further object of the present invention to provide a method for depositing metal over exposed portions of silicon or metal, which is insensitive to the height of the area where metal is to be deposited within the integrated circuit structure.

U.S. patent application Ser. No. 189,495, filed Sept. 22, 1980 (TI-8478), now issued as U.S. Pat. No. 4,388,517, which is hereby incorporated by reference, discloses a method for selective deposition of metal according to the thermal conductivities of different areas.

Allowed U.S. patent application Ser. No. 384,355 now U.S. Pat. No. 4,448,636 (TI-9353), which was filed simultaneously with the present application and which is hereby incorporated by reference, teaches a method for selective deposition of thin films on areas exposed by a patterned resist layer.

U.S. patent application Ser. No. 384,354 now U.S. Pat. No. 4,465,716 (TI-9515), which was filed simultaneously with the present application and which is hereby incorporated by reference, teaches a method for selective deposition of composite materials, such as silicides or TiW, onto areas exposed by a patterned insulator.

SUMMARY OF THE INVENTION

The present invention provides a method for filling contact holes, or other depressions, with metal or silicide. By repeated deposition and laser-assisted removal of thin metal layers, metal is gradually built up over high-thermal-conductivity areas. By this means, a contact hole to silicon may be reliably filled with metal. Note that this sequence provides a completely unpatterned process to achieve this end. The present invention may also be applied, beyond the stage where planarization has been achieved, to create metal bumps above a contact, with no additional patterningstep, to facilitate bonding.

According to the present invention, there is provided: a process for filling recesses in a low-thermal-conductivity material, comprising the steps of: providing a high-thermal-conductivity first layer; depositing a low-thermal-conductivity additional layer above the first layer; etching a contact hole through a selected portion of the low-thermal-conductivity layer to expose the first layer; depositing a high-thermal-conductivity top layer overall; irradiating the top layer at a power density greater than 1 kW per square centimeter and an energy density of greater than 0.05 Joules per square centimeter, whereby the top layer loses its adhesion to the low thermal-conductivity layer; mechanically removing remaining portions of the top layer from above the low-thermal-conductivity layer; and repeating the deposition, irradiation, and removal steps until the selected portion of the additional layer has been filled to at least the approximate height of the additional layer.

According to the present invention, there is provided: a process for filling recesses in a low-thermal-conductivity material, comprising the steps of: providing a high-thermal-conductivity first layer; depositing a low-thermal-conductivity second layer above the first layer; etching a contact hole through a selected portion of the second layer, to expose the first layer; depositing a high-thermal-conductivity top layer overall; irradiating the top layer at an energy density which is greater than 0.1 Joules per square centimeter, whereby portions of the top layer which are not in contact with the high-thermal-conductivity first layer are vaporized; and repeating the deposition, and irradiation steps until the contact hole has been filled to at least the approximate height of the second layer.

According to the present invention, there is provided: a process for filling recesses in an insulating layer by means of high-electrical-conductivity material, comprising the steps of: providing a patterned resist layer, the resist layer exposing selected depressed areas where a preselected high-electrical-conductivity material is to be deposited; depositing a uniform layer of the high-electrical-conductivity material; flash-heating the uniform layer, whereby the interface between the resist and the high-electrical-conductivity material is broken; mechanically removing portions of the top layer from above the resist layer; and repeating the deposition, flash-heating, and removal steps until the depression has been filled to a desired height.

BRIEF DESCRIPTION OF THE DRAWINGS

The present invention will be described with reference to the accompanying drawings wherein.

DESCRIPTION OF THE PREFERRED EMBODIMENTS

The present invention teaches a method of contact planarization by repeated deposition of thin films of metal (or silicide), followed by removal of the metal from areas apart from the contact locations. Three principal embodiments are alternatively used to accomplish this, and numerous variations in parameters and materials may also be used in practicing the invention.

Figure 1:
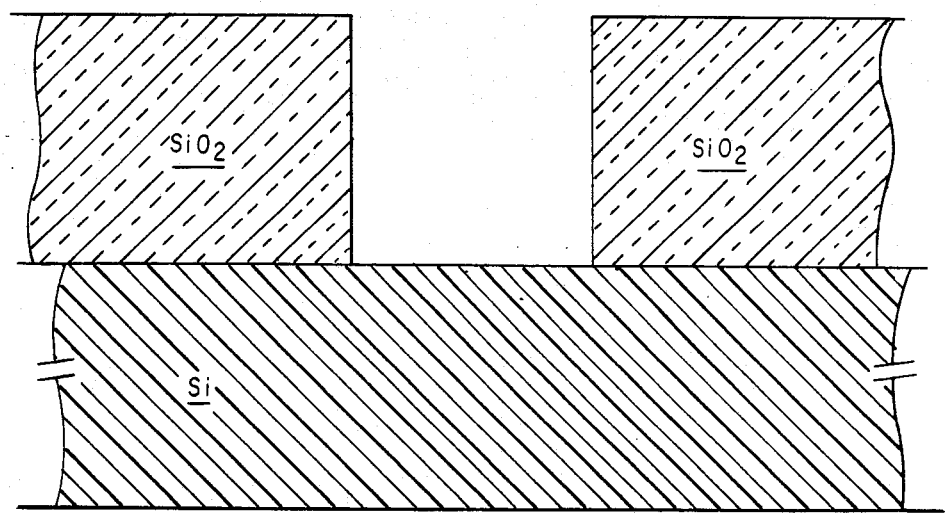
FIG. 1 shows an area where an insulator has been etched to expose a contact area of a semiconductor substrate.
Figure 2:
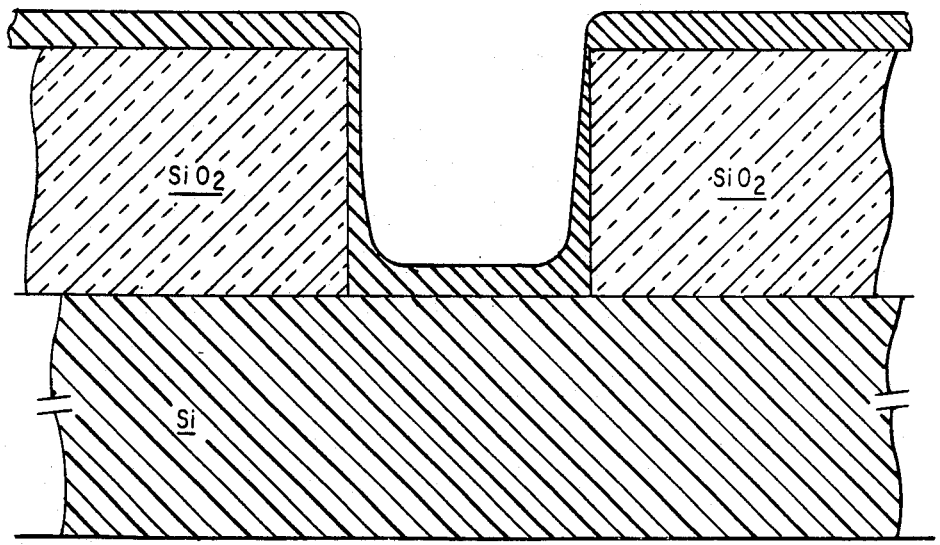
FIG. 2 shows a uniform thin film deposited over the structure of FIG. 1.

FIG. 1 shows an example of a contact area in an integrated circuit structure. Shown schematically is a layer of oxide over silicon substrate, where a hole has been etched in the oxide to permit contact of the silicon substrate by metal layer. In the present invention, this contact hole can be etched using an extremely anisotropic etch, so that the contact hole has steep or completely vertical walls.

In the first (and presently preferred) of the principal embodiments, a thin film of a composite material is then deposited overall by sputtering. In a sample embodiment of the present invention, where the contact hole is one micron deep, a 300 nm tensile layer of TiW is deposited first.

A pulse of radiant energy is then applied. As presently preferred, a Q-switched laser, such a ruby laser, is used to apply a pulse of 0.5 Joules per square centimeter with a time duration of about 30 nanoseconds. The result of such a short pulse is that the portion of the metallization layer 10 over the oxide layer 12 will be shattered, due to the physical stress caused by the volumetric change induced by the extremely rapid temperature change in the metal layer. However, the heat-sinked portion of the metal layer over the exposed contact will not be heated to as high a temperature, and will be cooled far more rapidly, so that the heat-induced stress is lower, and drastic phase change does not occur. Titanium-tungsten alloy (TiW) is particularly useful in this regard. However, a large variety of other composite materials can also be used. As discussed in more detail in simultaneously-filed U.S. patent application Ser. No. 384,354 (TI-9515), any alloy in which the alloy has a smaller volume than its components is suitable. Most intermetallic compounds and silicides fill this requirement.

Moreover, this embodiment can be applied using a multilayer stack. That is, for example, a layer of TiW (i.e. an alloy containing from 2 to 20% titanium, and, in this example, 10%) is first deposited by sputtering. A layer of a second material, such as a pure metal having relatively low ductility, e.g. chromium or vanadium, is then deposited by sputtering or evaporation. A laser pulse is then applied, as described above, to shatter the TiW and thereby lift off the upper layer of metal.

In practicing this embodiment, each metal layer should preferably be deposited by sputtering. As-deposited films of sputtered deposit material will have extremely small grain size, typically less than 50 Angstroms, and will undergo sharp volumetric change when a phase change is induced by a thermal pulse. Preferably the film is deposited under initial conditions such that it is in tension at room temperature, so that the additional tension induced by the phase change adds to existing static tension, to sever the adhesion between the deposited film and the oxide layer.

It is not strictly necessary to use a Q-switched laser in this embodiment, but an ordinary pulsed laser may also be used. Moreover, it is alternatively possible to use other pulsed heat sources, having a pulse duration on the order of milliseconds, although this is not preferred. Once the metal over the oxide has been shattered, it can be physically removed by, e.g., floating off with an airjet.

A second embodiment of the present invention uses selective vaporization instead, as taught in U.S. patent application Ser. No. 189,495 (TI-8478), filed Sept. 22, 1980, which is hereby incorporated by reference. In this embodiment, the different thermal characteristics are used to vaporize the metal film over the oxide, while the metal within the contact recess, being heat-sinked, never reaches as high a temperature and is not vaporized. Any silicide or metal can be used, although it is preferred that the film not include refractory metals. In this embodiment, a substantially longer pulse can be used, since the essential requirement is merely that the temperature of the metal film above the oxide areas be raised to above the vaporization temperature of the metal. In fact, the longer the pulse of radiant energy used, the more closely will the different temperatures of different areas of the metal film approach steady state differences dictated by heat-sinking and radiative coupling. However, an excessively long pulse may couple enough energy into the oxide to cause thermal damage in the oxide. Thus, preferred embodiments of the present invention are limited to pulse lengths less than 100 milliseconds. In this second embodiment of the invention, the required energy density is on the order of a Joule per square centimeter, or less if a shorter pulse is used. (This energy density is of course dependent on the thickness of the metal layer, and must be made proportionally larger for thicker metal films. In the first embodiment of the invention, where an extremely short pulse is used, energy densities as low as 0.2 Joules per square centimeter may be used, as long as the power density is at least 100 kW per square centimeter.

In the first (short-pulse) embodiment, the metal thickness is preferably kept thin, to enhance the effect of thermal shock in the metal over oxide regions. Specifically, the metal film thickness in the first embodiment is preferably between 50 nm and 1500 nm. In the second embodiment, the metal thickness is limited merely by the total net heat input into the integrated circuit structure. That is, not only will substantial thermal strain be placed on the upper surface of the oxide layer as the metal is evaporated, but also heat will be coupled locally into the semiconductor substrate at the bottom of the contact hole, resulting in localized thermal stress in the silicon.

In the third principal embodiment, flash-assisted lift-off is used to selectively deposit a thin film of metal. Note that this embodiment differs substantially from the preceding two embodiments, in that the preceding embodiments require no additional patterning step whatsoever, but automatically accumulate the deposited film only on top of high-thermal-conductivity areas. By contrast, the third principal embodiment deposits thin films of material on areas exposed by a patterned resist mask, and does not deposit material over the resist itself. However, in this embodiment, the resist is not disturbed by the selective deposition process, so that this embodiment, like the first and second principal embodiments, permits repeated deposition of a metal film on a previously defined area. The method used in this embodiment is described in greater detail in simultaneously-filed U.S. patent application Ser. No. 384,354 (TI-9515).

In this embodiment, a previously-generated patterned resist layer may be used. For example, the resist used to define the contact hole etching may be left in place during succeeding steps of metal deposition. A metal or silicide is deposited uniformly over the patterned resist layer. Pulsed illumination is then applied. The localized heating at the metal/resist interface causes outgassing from the resist, which breaks the adhesion between the metal layer and the resist. The metal over the resist is then mechanically separated, e.g. by floating off using an airstream, and the net result is that a thin layer of metal is selectively deposited in only those areas exposed by the resist. After this deposition and selective removal step, the resist remains intact, so that many such thin layers can be sequentially deposited. In this embodiment, it is preferable that the material deposited have low tensile strength and ductility, to assist in separation of the film adjacent to the contact areas.

Figure 3:
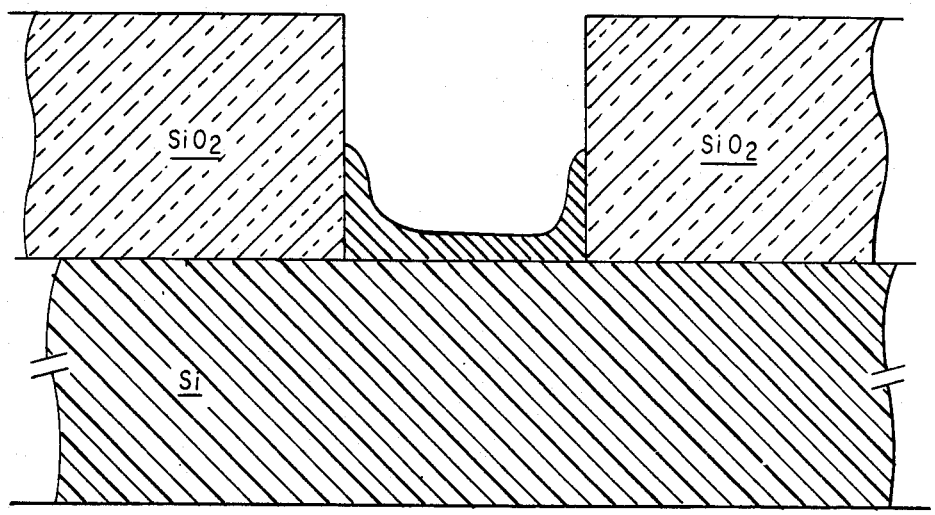
FIG. 3 shows a further stage of processing after the thin film shown in FIG. 2 has been removed except over the contact area.
Figure 4:
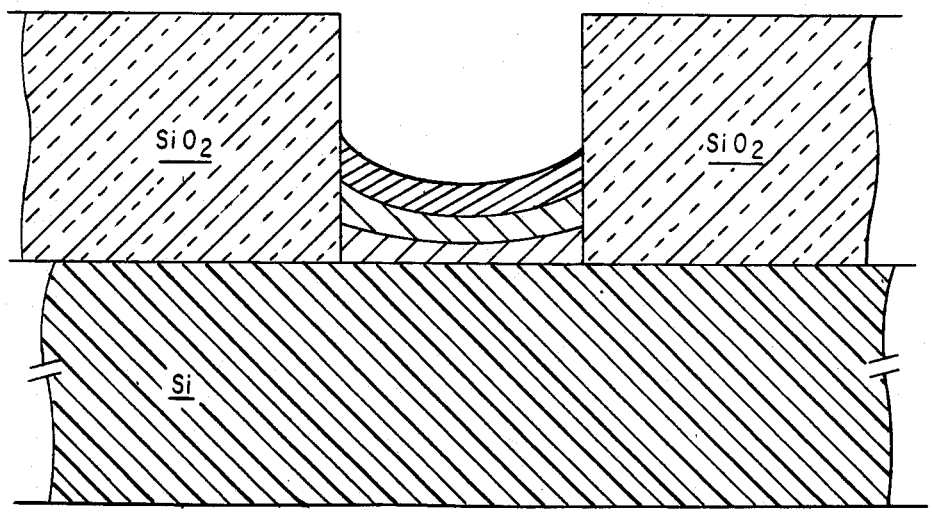
FIG. 4 shows a multilayer structure fabricated by the method of the present invention.

Anyone of these metal-deposition processes is then repeated until the contact hole has been filled. Note that the filled hole, as shown in FIG. 3, will have a somewhat higher metal thickness at the edges than at the center, if the hole is relatively large. However, where this feature is undesirable, it may be removed by isotropic etch. This will produce a more planar metal profile which is recessed in the contact hole, and selective deposition steps may then be applied again to fill the hole to its top with a planar metal surface.

The present invention is not limited to repetitive deposition of the same metal, but may also be applied to sequentially deposition of different metals. In one example, a metal to assist ohmic contact formation (such as antimony) is applied first, a diffusion barrier (such as molybdenum or tungsten) is applied next, and a metal such as aluminum for low contact resistance is applied last.

A further advantage of this invention is that the metal to be patterned can be selected to be any metal, including noble or refractory metals which are otherwise quite difficult to etch.

For simplicity, the present invention has been discussed as if a contact were to be formed through a single thick oxide layer. However, multiple intermediate stages of device structure will typically have been fabricated in other areas of an integrated circuit structure. Since these intermediate structural levels are not relevant to the process of contact formation, they are not specifically discussed here.

The present invention has been described primarily with reference to planarization of contact holes. However, the present invention provides a general capability for planarization of depressed areas in an integrated circuit structure, and therefore may be applied to a wide variety of uses, including future needs which are not yet recognized.

Moreover, if deposition steps according to the present invention are repeated after planarization has been achieved, selective deposition will continue to selectively deposit metal over the metal contact area. This step can be repeated to produce a metal bump, which is raised above the surface of the integrated circuit structure. Thus, at the last stage of fabrication of an integrated circuit, a structure may be generated which has contact bumps raised above the level of an otherwise approximately planar multi-level oxide or protective overcoat. Such contact bumps can be very useful in probe testing and in making chip contacts, and can particularly facilitate automatic fabrication of high-density contacts to a chip.

It will be obvious to those skilled in the art that a broad range of equivalents may be used in practicing the invention, which is not limited except as specified in the following claims.

What we claim is:

1. A process for filling recesses in a low-thermal-conductivity material, comprising the steps of:
   providing a high-thermal-conductivity first layer;
   depositing a low-thermal-conductivity additional layer above said first layer;
   etching a contact hole through a selected portion of said low-thermal-conductivity layer to expose said first layer;
   depositing a high-thermal-conductivity top layer overall;
   irradiating said top layer at a power density greater that 1 kW per square centimeter and an energy density of greater than 0.05 Joules per square centimeter, whereby said top layer loses its adhesion to said low-thermal-conductivity layer;
   mechanically removing remaining portions of said top layer from above said low-thermal-conductivity layer; and
   repeating said deposition, irradiation, and removal steps until said selected portion of said additional layer has been filled to at least the approximate height of said additional layer.

2. A process for filling recesses in a low-thermal-conductivity material, comprising the steps of:
   providing a high-thermal-conductivity substrate;
   depositing one or more low-thermal-conductivity layers above said substrate;
   etching a contact hole through a selected portion of said low-thermal-conductivity layer to expose said substrate;
   depositing a composite top layer film over all;
   irradiating said top layer, at a total energy density which is greater than 10 microJoules per square centimeter per nanometer of thickness of said top layer, whereby said top layer loses adhesion to said low-thermal-conductivity layer;
   mechanically removing portions of said top layer from above said low-thermal-conductivity layer; and
   repeating said deposition, irradiation, and removal steps until said contact hole has been filled with said metal.

3. The process of claim 1 or 2, wherein said top layer comprises a composite material having first and second components, one of said components of said composite material being a metal.

4. The process of claim 3, wherein said first and second components of said composite material have respective separate volumes which are in sum greater than the volume of an alloy formed from said first and second materials.

5. The process of claim 1 or 2, wherein said top layer comprises a metal silicide.

6. The method of claim 1 or 2, wherein said top layer comprises an intermetallic compound.

7. The process of claim 1 or 2, wherein said top layer comprises a mixture of titanium and tungsten.

8. The process of claim 1 or 2, wherein said top layer is deposited by sputtering.

9. The method of claim 1 or 2, wherein said top layer is deposited in tension.

10. The process of claim 4, wherein said top layer is deposited by sputtering in an approximately amorphous condition.

11. The process of claim 10, wherein said top layer is deposited in tension.

12. A process for filling recesses in a low-thermal-conductivity material, comprising the steps of:
    providing a high-thermal-conductivity first layer;
    depositing a low-thermal-conductivity second layer above said first layer;
    etching a contact hole through a selected portion of said second layer, to expose said first layer;
    depositing a high-thermal-conductivity top layer overall;
    irradiating said top layer at an energy density which is greater than 0.1 Joules per square centimeter, whereby portions of said top layer which are not in contact with said high-thermal-conductivity first layer are vaporized; and
    repeating said deposition, and irradiation steps until said contact hole has been filled to at least the approximate height of said second layer.

13. The method of claim 12, wherein said second layer comprises oxide.

14. The method of claim 12, wherein said irradiation step is applied at an energy density which is at least one milliJoule for each nanometer of thickness of said top layer.

* * * * *